US007593826B2

(12) United States Patent
Weese

(10) Patent No.: US 7,593,826 B2
(45) Date of Patent: Sep. 22, 2009

(54) CALIBRATION METHOD FOR SMART ANTENNA ARRAYS

(75) Inventor: Kurt Weese, Ditzingen (DE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 11/517,308

(22) Filed: Sep. 8, 2006

(65) Prior Publication Data

US 2007/0069945 A1 Mar. 29, 2007

(30) Foreign Application Priority Data

Sep. 28, 2005 (EP) ................................ 05292023

(51) Int. Cl.
*G01R 35/00* (2006.01)

(52) U.S. Cl. ................................................. 702/106

(58) Field of Classification Search .................. 702/89, 702/106, 72, 75, 79, 125, 176; 342/174, 342/358; 455/67.11, 522
See application file for complete search history.

(56) References Cited

U.S. PATENT DOCUMENTS 6,037,898 A 3/2000 Parish et al.
6,236,839 B1 * 5/2001 Gu et al. .................. 455/67.14
6,636,495 B1 * 10/2003 Tangemann ................. 370/334
6,693,588 B1 2/2004 Schlee
7,039,016 B1 * 5/2006 Lindskog et al. ............ 370/252
2001/0005685 A1 * 6/2001 Nishimori et al. ........... 455/562
2005/0239506 A1 * 10/2005 Li ............................. 455/561
2006/0019712 A1 * 1/2006 Choi ....................... 455/562.1

FOREIGN PATENT DOCUMENTS

EP 1 548 957 A 6/2005

OTHER PUBLICATIONS

Litwin et al., "The Principles of OFDM", Jan. 2001.*
Herbert M. Aumann et al, "Phased Array Antenna Calibration and Pattern Prediction Using Mutual Coupling Measurements", IEEE Transactions on Antennas and Propagation, IEEE, Inc., New York, US, vol. 37, No. 7, Jul. 1, 1989, pp. 844-850 XP000035980.

* cited by examiner

*Primary Examiner*—Michael P Nghiem
(74) *Attorney, Agent, or Firm*—Sughrue Mion, PLLC

(57) ABSTRACT

The invention relates to a method of calibrating the reception path and the transmit path of an antenna array which is formed of at least three antennas and which is connected to a digital signal processor. For calibrating the reception path a signal of known amplitude and known phase is transmitted by a single antenna and received by n−1 antennas. For calibrating the transmit path of an antenna array path a signal of known amplitude and known phase is transmitted by n−1 antennas and received by the $n^{th}$ antenna. A phase difference and an amplitude difference between each of the n−1 transmitted signals is evaluated and the steps are repeated with a new transmit antenna until every antenna has been used as a transmit antenna. In the last step the phase differences and their associated amplitude differences are set to the factory-said values.

12 Claims, 3 Drawing Sheets

CALIBRATION METHOD FOR SMART ANTENNA ARRAYS

The invention is based on a priority application EP 05292023.8 which is hereby incorporated by reference.

TECHNICAL FIELD

The invention relates to a wireless telecommunication system and to the operation of antenna arrays of such systems. More particularly, the invention refers to a method of calibrating a reception path and a transmit path of an antenna array, whereby the antenna array is connected to a digital signal processor and comprises at least three antennas. Furthermore, the invention refers to an antenna array of a wireless telecommunication system for carrying out the above method and to a computer program product to carry out the method.

BACKGROUND OF THE INVENTION

For an efficient use of resources of a wireless telecommunication system smart antenna systems attract more and more attention. Generally, co-located with the base station, a smart antenna system combines an antenna array with a digital signal-processing capability to transmit and receive signals in an adaptive, spacially sensitive manner. In other words, such a system can automatically change the directionality of its radiation patterns in response to its signal environment. This can dramatically increase the performance characteristics such as the capacity of the system.

To obtain these benefits a smart antenna array has to be calibrated. In the prior art a separate antenna being located at a well-known location is used for this purpose. This extra antenna sends beacon signals to the antenna array and receives signals from the array. By an analysis of changes in the phase and the amplitude of the signals the individual antennas of the antenna array can be calibrated.

SUMMARY OF THE INVENTION

It is an object of the invention to provide a method, a corresponding antenna array and a computer program product with which an antenna array can be calibrated without using external hardware.

This object and other objects are solved by the features of the independent claims. Preferred embodiments of the invention are described by the features of the dependent claims. It should be emphasized that any reference signs in the claims shall not be construed as limiting the scope of the invention.

According to a first aspect of the invention a method of calibrating a reception path of an antenna array is provided. The antenna array is connected to a digital signal processor and comprises $n \geqq 3$ antennas. n is an integer such that the antenna array comprises at least three antennas. In a first step of this method an electromagnetic signal of known amplitude and known phase is transmitted by a single antenna Tx. This antenna Tx is called the transmit antenna and is an antenna of said antenna array. The transmitted signal is received by the other n−1 antennas $Rx^1$, $Rx^2$, . . . $Rx^{n-1}$ of said antenna array which will be called receiving antennas. In a second step a phase difference and an amplitude difference between each of the n−1 received signals is determined. Then, the last two steps are repeated with a new transmit antenna until every antenna has been used as a transmit antenna. After carrying out all these measurements the obtained phase differences and their associated amplitude differences are compensated for to their factory-set values.

According to a second aspect of the invention a method of calibrating a transmit path of an antenna array is provided. The antenna array is connected to a digital signal processor and comprises $n \geqq 3$ antennas. The method comprises a first step of transmitting an electromagnetic signal of known amplitude and known phase by n−1 antennas $Tx^1$, $Tx^2$, . . . , $Tx^{n-1}$. The n−1 antennas are called transmit antennas. The n−1 signals are received by the n-th antenna Rx being called the receiving antenna. In a second step a phase difference and an amplitude difference between each of the n−1 transmitted signals is determined. Then, the last two steps are repeated with the new receiving antenna until every antenna has been used as a receiving antenna. Finally, the obtained phase differences and the associated amplitude difference are compensated for to their factory-set values.

The idea of the calibration of the transmit path is that the received signals, which are different to each other due to modulation, can be assigned to the individual transmit antennas. Then, differences in amplitude and phase of the individual signals with respect to their factory-set values are determined and are compensated for.

Both methods, being carried out individually or being carried out in combination, provide the advantage that no extra hardware, e.g. an antenna separate and distinct from the antennas of the antenna array, is needed for the calibration. Correspondingly, there is no need for the rental of premises on which such an additional antenna for transceiving beacon signals is located. As will be described below in more detail, the calibration is easy to carry out as it only needs the insignificant modification of the computer program residing in the digital signal processor.

As can be derived from the above explanations both methods comprise a measurement step, a determination step, and a compensation step. In both methods it is possible to evaluate the phase difference(s) and the amplitude difference(s) after a single measurement, to change the antenna, and then to proceed with the measurement. It is however possible as well to carry out all measurements, then to evaluate all phase differences and amplitude differences, and then to carry out the compensation step.

According to a preferred embodiment the transmit antennas transmit their signals simultaneously. In this way a calibration of the transmit path can be carried out in a faster way. Furthermore, and more importantly, changes of parameters of the antenna array between the individual transmissions are avoided such that the accuracy of the measurement values is improved. In order to enable the single receiving antenna to distinguish the n−1 signals they are individually modulated or individually encoded.

Distinguishing the individual signals received by the single receiving antenna can be done by transmitting signals which are sub-carriers of an OFDM (Orthogonal Frequency Division Multiplexing) signal, and whereby the sub-carriers are different from each other. In this sense, the invention is applicable for wireless communication systems using OFDM, e.g. for WIMAX-systems.

As mentioned above, it is desirable that all signals are transmitted at the same time when the transmit path is calibrated. This does not necessarily mean that all signals must be emitted at exactly the same time, but that it is acceptable to have slight time differences between individual transmissions. In this sense, using a time division multiplexing (TDM) approach is possible, such that the invention can be carried out for all TDMA systems.

As mentioned above it is possible to use sub-carriers of an OFDM-signal when calibrating the transmit path. When doing this it would be possible to choose sub-carriers which are close to each other with respect to their frequency. In this way the calibration is only carried out for a limited part of the channel bandwidth. To ensure that the calibration of the antenna array is performed over the whole channel bandwidth the sub-carriers should be preferably distributed over the whole channel bandwidth.

It goes about saying that the method for calibrating the reception path and the method for calibrating the transmit path can be carried out by means of computer program. After receiving the signals the computer program can process the signals and can compensate the phase differences and the associated amplitude differences to their factory-set values. This computer program can reside on a computer readable medium such as a CD or a DVD. This computer readable medium comprises computer program code means which, when said program is loaded, make a computer executable for executing the methods as described above.

As indicated above the two methods mentioned above can be carried out individually or in combination.

According to another aspect of the invention an antenna array for a wireless communication system is provided whereby the antenna array is connected to a digital signal processor comprising $n \geqq 3$ antennas. Furthermore, the digital signal processor has means for evaluating a phase difference and an amplitude difference between a digitized signal transmitted by a first antenna of the said antenna array and the same signal as received by a second antenna of said antenna array, and it has means for compensating for a phase difference and an amplitude difference to its corresponding factory-set value. These two means can be implemented in hardware or in software. In the first case the means might be implemented as a FPGA or as an ASIC. More flexibility is provided when the means are individual modules of a computer program or when the means are separate programs. As a matter of fact, the two means can be combined into a single means having both functionalities. In this case the means can be chosen to be part of the firmware of the digital signal processor.

In a preferred embodiment of the antenna array it is adapted to transmit OFDM signals, and is in particular a TDMA OFDM system with an adaptive antenna.

These and other aspects of the invention will be apparent from and elucidated with reference to the embodiments described thereafter. It should be noted that the use of reference signs shall not be construed as limiting the scope of the invention.

DETAILED DESCRIPTION OF PREFERRED EMBODIMENTS

Figure 1:
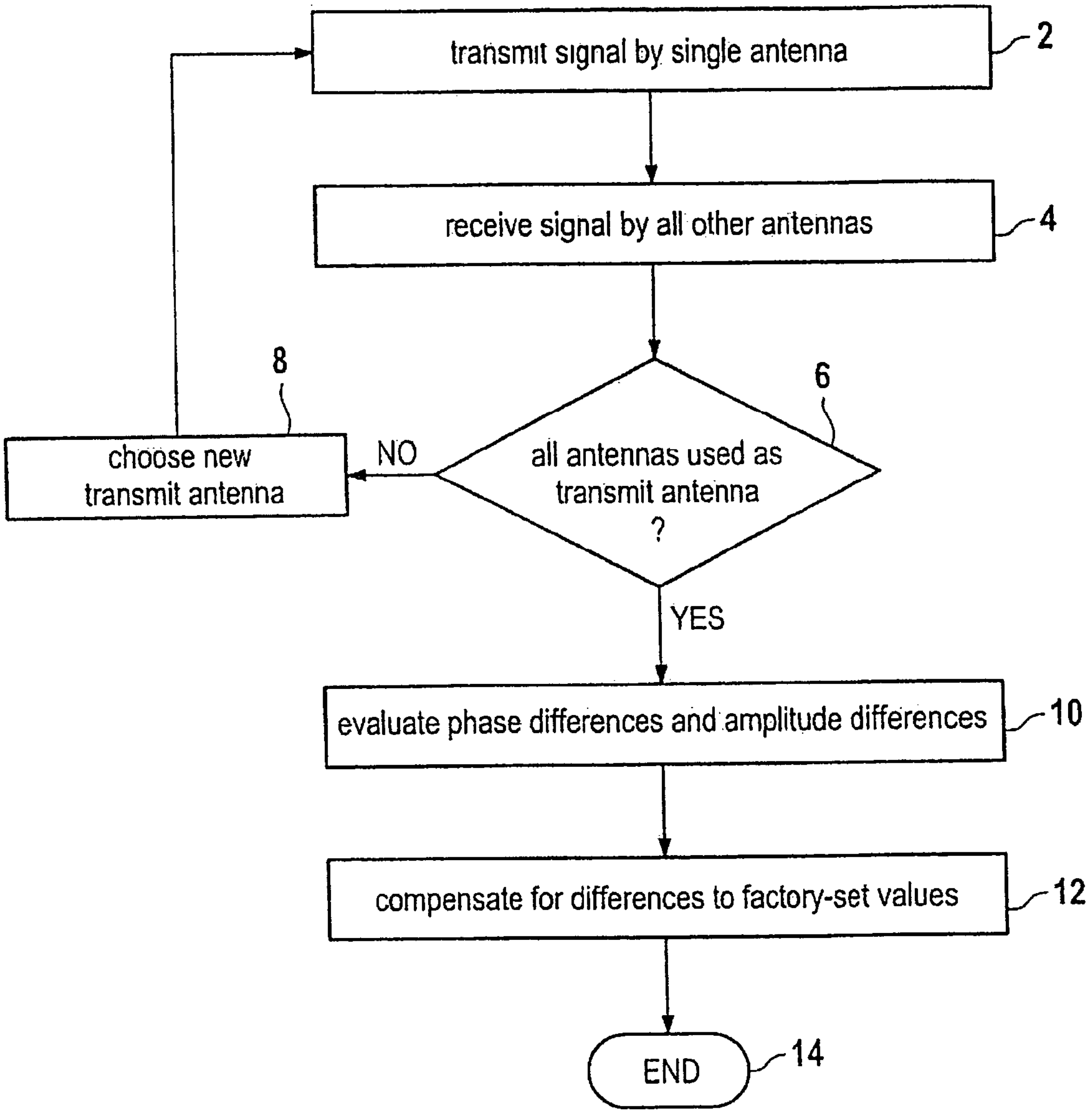
FIG. 1 shows a flowchart illustrating the calibration of the reception path of the antennas of the antenna array.

FIG. 1 shows a flowchart illustrating the way in which the reception path of an antenna array is calibrated. The method starts with step 2. In step 2 a transmit signal is transmitted by a single antenna Tx of an antenna array. The method then proceeds with step 4 in which the transmitted signal is received by all other antennas, i.e. the other n−1 antennas $Rx^1$, $Rx^2$, . . . $Rx^{n-1}$ of the antenna array. In step 6 it is checked whether all antennas have been used as transmit antennas. If this condition is not satisfied a new transmit antenna is chosen in step 8, such that the method proceeds with step 2.

If every antenna has been used as a transmit antenna the method proceeds with step 10. In this case all measurement values have been obtained and the method processes these measurement values. This processing starts with step 10. In step 10 the phase differences and the amplitude differences between all received signals originating from the same transmit antenna are evaluated.

If antenna 2 is the transmit antenna, antenna 2', 2'' and 2''' serve as receiving antennas such that they receive the transmitted signal. Then the phase difference and the amplitude difference between the signals received by antennas 2', 2'' and 2''' are determined. Then antenna 2' my be the new transmit antenna, such that the phase difference and the amplitude difference between the signals received by antennas 2, 2'' and 2''' are determined. If antenna 2'' is the transmit antenna, the phase difference and the amplitude difference between the signals received by antennas 2, 2' and 2''' are determined. In a last step 2''' is the new transmit antenna, and the phase difference and the amplitude difference between the signals received by antennas 2, 2' and 2'' are determined. In total 12 amplitude differences and corresponding phase differences are determined.

After evaluating the amplitude and phase differences the method proceeds with step 12 in which these differences are compensated for to their factory-set values. The factory-set values are known from the manufacturer of the antenna array. If this is done the method ends with step 14.

Figure 2:
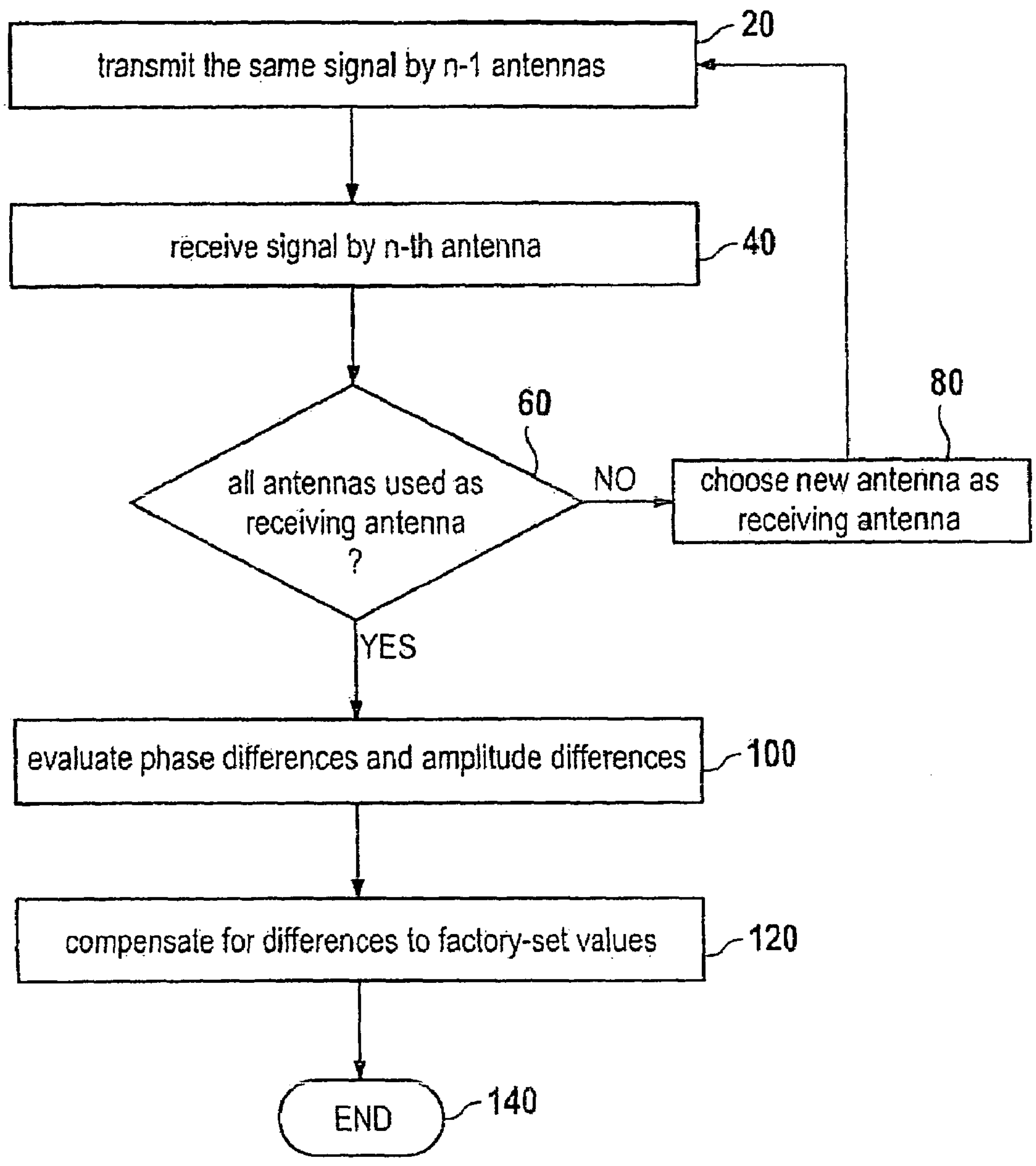
FIG. 2 shows a flowchart illustrating the calibration of a transmit path of the antennas of the antenna array, FIG. 3 schematically shows an antenna array according to the invention.

FIG. 2 shows a flowchart illustrating the calibration of the transmit path of an antenna array. The method starts with step 20.

In step 20 a single signal of a known amplitude and known phase is transmitted by n−1 antennas. In step 40 the n−1 signals transmitted by the n−1 antennas in step 20 are received by the n-th antenna. The method then proceeds with step 60, in which it is checked whether all antennas have already been used as receiving antennas. If this is not the case, a new antenna is chosen as a receiving antenna in step 80. The method then proceeds with step 20.

If all antennas have been used as receiving antennas the method proceeds with step 100. In this case the method has already obtained all measurement values needed for the calibration. Processing the measurement values starts with step 100, in which the phase differences and the amplitude differences between each of the n−1 transmitted signals and received by a single antenna are evaluated. All these phase differences and amplitude differences are compared with their known factory-set values, and are compensated for. The method then ends with step 140.

The two methods illustrated by flowcharts only use the antenna array as such, namely the antennas and the processing logic of the antenna array, to perform the calibration. Thus no extra hardware is needed which saves hardware resources and money for the rental of premises on which a beacon antenna would be located.

Figure 3:
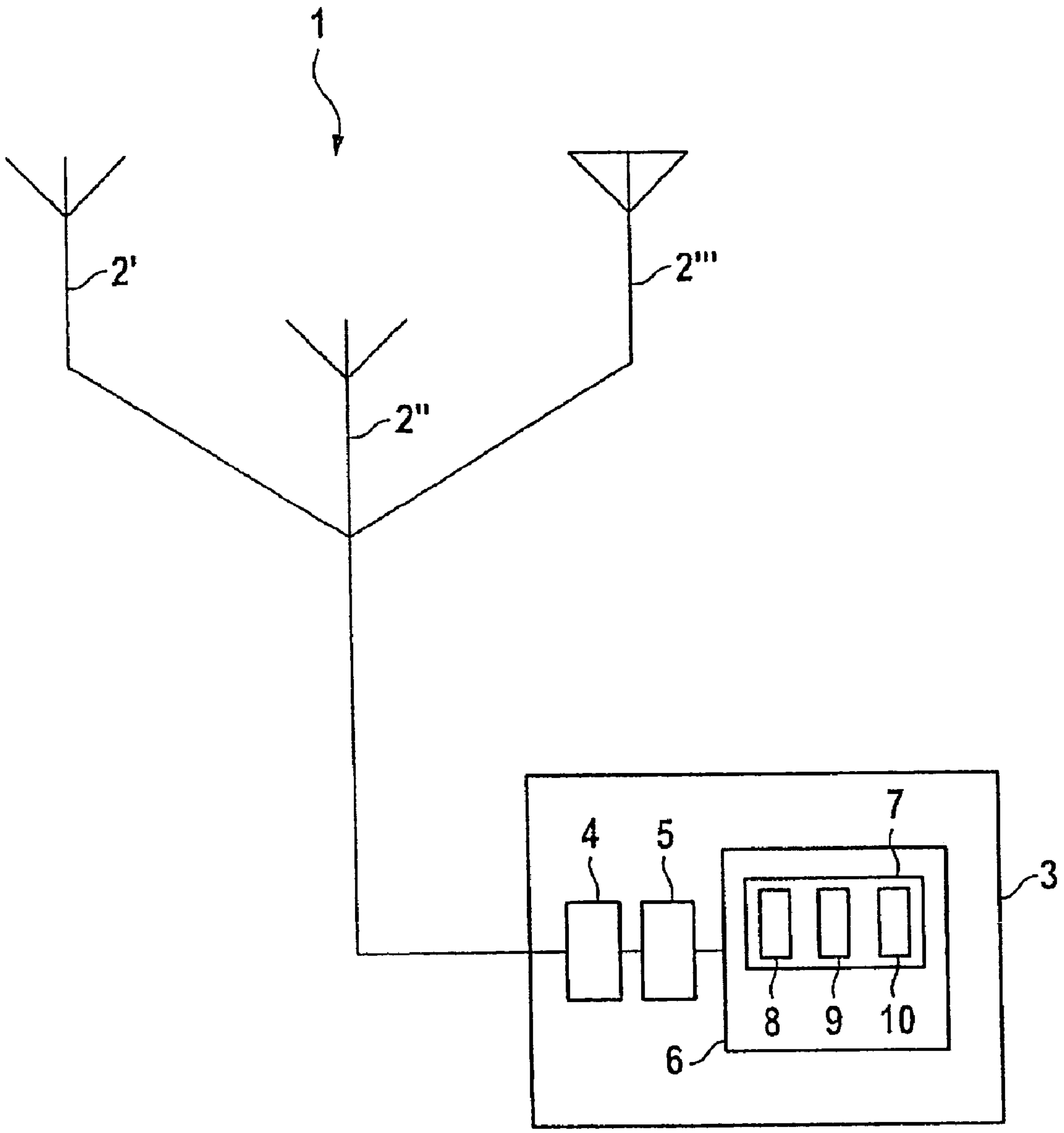

FIG. 3 shows an antenna array according to the invention. The antenna array 1 comprises three antennas 2', 2'', 2''' and is connected to a processing unit 3. Processing unit 3 comprises a receiver 4 for receiving the signals from the antenna array. The input of the receiver 4 is digitized by an analogue-to-digital converter 5, which outputs the digitized signals to a digital signal processor 6. The digital signal processor 6 has a firmware 7 comprising individual modules 8, 9, 10. A first module 8 is adapted for evaluating a phase difference and an amplitude difference between a first digitized signal and a second digitized signal. A second module 9 of the firmware 7 is able to compensate for a phase difference and an amplitude difference as evaluated by module 8 to a corresponding factory-set value. Master module 10 governs the way in which the method for calibrating the transmit path and for calibrating the reception path is carried out.

The description of the last paragraph assumes that the processing logic 3 receives signals from the antenna array 1. In order to perform the calibration methods it is also necessary to address the individual antennas 2', 2" and 2'" to transmit signals. For that purpose unit 5 is also adapted to operate as a digital-to- analogue converter out-putting an analogue signal to unit 4 which is adapted to transmit an analogue signal to a single antenna 2', 2" or 2'".

List of reference numerals

| | |
|---|---|
| 1 | antenna array |
| 2 | antenna |
| 2' | antenna |
| 2" | antenna |
| 2'" | antenna |
| 4 | transceiver |
| 5 | converter |
| 6 | digital signal processor |
| 7 | firmware |
| 8 | evaluation means |
| 9 | compensation means |
| 10 | master module |

The invention claimed is:

1. A method of calibrating a reception path of an antenna array, the antenna array being connected to a digital signal processor and comprising $n \geqq 3$ antennas, the method comprising the steps of:

a) transmitting an electromagnetic signal of known amplitude and known phase by a single transmit antenna, and receiving the electromagnetic signal by other $n-1$ receiving antennas of the antenna array, b) evaluating a phase difference and an amplitude difference between each of the $n-1$ received signals, c) repeating steps a) and b) with a new transmit antenna until every antenna of the antenna array has been used as the single transmit antenna, d) compensating the phase differences and associated amplitude differences to factory-set values.

2. The method according to claim 1, wherein the method is at least partially carried out by a computer program.

3. A computer program product, the computer program product comprising a computer readable medium, having thereon computer program code executable for executing the method according to claim 1.

4. A method of calibrating a transmit path of an antenna array, the antenna array being connected to a digital signal processor and comprising $n \geqq 3$ antennas, the method comprising the steps of:

a) transmitting electromagnetic signals of known amplitude and known phase by $n-1$ transmit antennas, and receiving the signals by the $n^{th}$ receiving antenna, b) evaluating a phase difference and an amplitude difference between each of the $n-1$ transmitted signals, c) repeating steps a) and b) with a new receiving antenna until every antenna of the antenna array has been used as a single receiving antenna, d) compensating the phase differences and their associated amplitude difference to their factory-set values.

5. The method according to claim 4, wherein the transmit antennas are transmitting simultaneously, and that the signals of the transmit antennas are individually modulated or individually encoded.

6. The method according to claim 4, wherein the signals transmitted by the transmit antennas are sub-carriers of an Orthogonal Frequency Division Multiplexing (OFDM) signal, and that the sub-carriers are different from each other.

7. The method according to claim 4, wherein the sub-carriers are distributed over the whole channel bandwidth.

8. The method according to claim 4, further comprising, prior to steps a), b), c) and d), e) transmitting an electromagnetic signal of known amplitude and known phase by a single transmit antenna, and receiving the electromagnetic signal by other $n-1$ receiving antennas of the antenna array, f) evaluating a phase difference and an amplitude difference between each of the other $n-1$ received signals, g) repeating steps e) and f) with a new transmit antenna until every antenna of the antenna array has been used as the single transmit antenna, and h) compensating the phase differences and associated amplitude differences of the other $n-1$ received signals to factory-set values.

9. A wireless communication system comprising an antenna array being connected to a digital signal processor and comprising $n \geqq 3$ antennas, the digital signal processor comprising a) means for evaluating a phase difference and an amplitude difference between a digitized signal transmitted by a first antenna of said antenna array and the same signal as transmitted by a second antenna of said antenna array, b) means for evaluating a phase difference and an amplitude difference between a digitized signal received by a first antenna of said antenna array and the same signal as received by a second antenna of said antenna array, and c) means for compensating phase differences and amplitude differences as evaluated in steps a) and b) to corresponding factory-set values.

10. The wireless communication system according to claim 9, further is adapted to transmit Orthogonal Frequency Division Multiplexing (OFDM) signals, in particular OFDM signals on a time division multiplexing (TDM) basis.

11. The wireless communication system according to claim 9, wherein the means for evaluating and the means for compensating are implemented in hardware or as computer programme modules.

12. The wireless communication system according to claim 11, wherein the means for compensating that are implemented in hardware are implemented as a field programmable gate array (FPGA) or as an application specific integrated circuit (ASIC).

* * * * *